United States Patent
Gan et al.

(10) Patent No.: US 6,645,631 B2
(45) Date of Patent: Nov. 11, 2003

(54) FLAME RETARDANT PHOSPHORUS ELEMENT-CONTAINING EPOXY RESIN COMPOSITIONS

(75) Inventors: Joseph Gan, Strasbourg (FR); Alan Goodson, Rheinmuenster (DE)

(73) Assignee: Dow Global Technologies Inc., Midland, MI (US)

( * ) Notice: Subject to any disclaimer, the term of this patent is extended or adjusted under 35 U.S.C. 154(b) by 0 days.

(21) Appl. No.: 09/734,537

(22) Filed: Dec. 11, 2000

(65) Prior Publication Data

US 2002/0119317 A1 Aug. 29, 2002

Related U.S. Application Data

(60) Provisional application No. 60/170,421, filed on Dec. 13, 1999.

(51) Int. Cl.[7] .................. B32B 27/38; C09K 21/12; C08G 59/68; C08G 63/00
(52) U.S. Cl. .................. 428/413; 252/601; 252/609; 528/89; 528/94; 528/108; 525/523; 525/526; 523/435
(58) Field of Search ................ 428/413; 528/89, 528/94, 108, 99; 525/480, 523, 526, 435; 252/601, 609

(56) References Cited

U.S. PATENT DOCUMENTS

| | | | |
|---|---|---|---|
| 3,859,379 A | * 1/1975 | Kitamura et al. ............ 260/831 |
| 4,066,628 A | 1/1978 | Ashida et al. .............. 260/77.5 |
| 4,328,150 A | 5/1982 | Kondow et al. ............. 523/400 |
| 4,925,901 A | 5/1990 | Bertram et al. ............. 525/482 |
| 4,973,631 A | 11/1990 | McGrath et al. ............ 525/534 |
| 5,036,135 A | 7/1991 | von Gentzkow et al. ... 524/786 |
| 5,066,735 A | 11/1991 | Walker et al. .............. 525/482 |
| 5,086,156 A | 2/1992 | McGrath et al. ............ 528/108 |
| 5,112,931 A | 5/1992 | Potter et al. ................. 528/45 |
| 5,364,893 A | 11/1994 | von Gentzkow et al. ... 523/429 |
| 5,376,453 A | 12/1994 | von Gentzkow et al. ... 428/415 |
| 5,453,453 A | * 9/1995 | Lamon et al. .............. 521/124 |
| 5,587,243 A | 12/1996 | von Gentzkow et al. ... 428/413 |
| 5,759,690 A | 6/1998 | von Gentzkow et al. ... 428/413 |
| 5,773,533 A | * 6/1998 | Horold ...................... 523/427 |
| 5,817,736 A | 10/1998 | von Gentzkow et al. ... 528/108 |
| 5,830,973 A | * 11/1998 | Horold et al. .............. 428/413 |
| 5,859,097 A | 1/1999 | Bruynseels et al. ........ 523/427 |
| 5,919,843 A | * 7/1999 | von Gentzkow et al. ... 523/451 |
| 5,955,184 A | * 9/1999 | Honda et al. ............. 428/297.4 |
| 5,959,043 A | * 9/1999 | Horold et al. .............. 523/457 |
| 5,994,429 A | * 11/1999 | Honda et al. ........... 428/402.21 |
| 6,180,695 B1 | * 1/2001 | Ito et al. .................... 523/451 |
| 6,207,786 B1 | * 3/2001 | Ishida et al. ................ 528/94 |
| 6,214,455 B1 | * 4/2001 | Honda et al. ............. 428/297.4 |
| 6,291,627 B1 | * 9/2001 | Wang et al. ............... 525/480 |
| 6,297,306 B1 | * 10/2001 | Osada et al. ............... 523/200 |

FOREIGN PATENT DOCUMENTS

| | | | |
|---|---|---|---|
| DE | 4432188 A1 | * 3/1996 | ......... C08L/63/00 |
| DE | 44 32 188 A | 3/1996 | |
| EP | 0 458 502 A2 | 11/1991 | |
| EP | 0 526 488 B1 | 11/1994 | |
| EP | 0 742 261 A2 | 11/1996 | |
| EP | 0 825 217 A1 | 2/1998 | |
| JP | 4-11662 | * 1/1992 | ......... C08L/101/00 |
| WO | WO 96/12751 | 5/1996 | |
| WO | WO 98/07731 | 2/1998 | |
| WO | WO 99/00451 | 1/1999 | |

OTHER PUBLICATIONS

WO 99/00451; Gan et al.; A Flame Retardant Epoxy Resin Composition; Jan. 7, 1999, Entire Document.*
English translantion JP 4–11662.*
Ching–Sheng, et al. "Novel flame retardant epoxy resins," Polymer Bulletin, vol. 41, pp. 45–52 (1998).
Derwent Abstract of DE 4308184.
Derwent Abstract of DE 4308185.
Derwent Abstract of EP 0 754 728.
Derwent Abstract of EP 0 806 429.
Derwent Abstract of JP 61,134,395.
Dhawan, et al. "Metallation induced rearrangement of tri-arylphoshates to tris (2–hydroxyaryl) phospine oxides," Synthetic Communications, vol. 17(4), pp. 465–468 (1987).
"Encyclopedia of Polymer Science and Engineering," "Epoxy Resins," vol. 6, pp. 348–356 (1986).
"Handbook of Epoxy Resins," H. E. Lee and K. Neville, section 11–14 (1967).
"Latent Catalysts for Epoxy Curing Systems," filed in the United States of America, Application Ser. No. 09/008,983; Applicant: Gan, et al. (Attorney Docket No. 42931A).

(List continued on next page.)

Primary Examiner—Robert Dawson
Assistant Examiner—Michael J Feely

(57) ABSTRACT

A flame retardant phosphorus element-containing epoxy resin composition substantially free of halogen, including:
(I) a non-halogenated epoxy resin material selected from:
  (A) a non-halogenated phosphorus element-containing epoxy resin;
  (B) a mixture of:
    (1) a non-halogenated, non-phosphorus element-containing epoxy resin, and
    (2) a phosphorus element-containing compound; or
  (C) the reaction product of:
    (1) a non-halogenated epoxy resin; and
    (2) a phosphorus element-containing compound; or
  (D) a combination of two or more of components (A) to (C); and
(II) (A) a multi-functional phenolic crosslinking agent having a hydroxy functionality of at least 2; (B) a material which forms a multifunctional phenolic crosslinking agent having a hydroxy functionality of at least 2, upon heating or (C) a mixture of components (A) and (B); in an amount of from about 50% to about 150% of the stoichiometric amount needed to cure the epoxy resin. Electrical laminate circuit boards having reduced flammability may be made from these compositions.

39 Claims, No Drawings

OTHER PUBLICATIONS

"Phosphorus Element–Containing Crosslinking Agents and Flame Retardant Phosphorus Element–Containing Epoxy Resin Compositions Prepared Therewith," filed in the United States of America, Application Ser. No. 09/734,904; Applicant: Brennan, et al. (Attorney Docket No. 42190).
Derwent Abstract of DE 44 32 188 A.
Derwent Abstract of Japan 2000273222.
Derwent Abstract of Japan 2001055484.
Patent Abstracts of Japan 03177451.
Patent Abstracts of Japan 61166822.
Wang, et al., "Synthesis and Properties of Phosphorus–Containing Epoxy Resins by Novel Method," Journal of Polymer Science: Part A: Polymer Chemistry, vol. 37, pp. 3903–3909 (1999).
Wang, et al., "Synthesis and properties of epoxy resins containing 2–(6–oxid–6H–dibenz(c,e)(1, 2)oxaphosphorin–6–yl)1,4–benzenediol," Polymer, vol. 39, No. 23, p. 5819–5826 (1998).

* cited by examiner

FLAME RETARDANT PHOSPHORUS ELEMENT-CONTAINING EPOXY RESIN COMPOSITIONS

This application claims the benefit of U.S. Provisional Application No. 60/170,421, filed Dec. 13, 1999.

BACKGROUND OF THE INVENTION

The present invention relates to curable phosphorus element-containing epoxy resin formulations, and particularly to formulations useful for making laminates for printed wiring boards and composite materials.

It is known to make electrical laminates and other composites from a fibrous reinforcement and an epoxy-containing matrix resin. Examples of suitable processes usually contain the following steps:

(1) an epoxy-containing formulation is applied to or impregnated into a substrate by rolling, dipping, spraying, other known techniques and/or combinations thereof. The substrate is typically a woven or non-woven fiber mat containing, for instance, glass fibers or paper.

(2) The impregnated substrate is "B-staged" by heating at a temperature sufficient to draw off solvent in the epoxy formulation and optionally to partially cure the epoxy formulation, so that the impregnated substrate can be handled easily. The "B-staging" step is usually carried out at a temperature of from 90° C. to 210° C. and for a time of from 1 minute to 15 minutes. The impregnated substrate that results from B-staging is called a "prepreg." The temperature is most commonly 100° C. for composites and 130° C. to 200° C. for electrical laminates.

(3) One or more sheets of prepreg are stacked or laid up in alternating layers with one or more sheets of a conductive material, such as copper foil, if an electrical laminate is desired.

(4) The laid-up sheets are pressed at high temperature and pressure for a time sufficient to cure the resin and form a laminate. The temperature of this lamination step is usually between 100° C. and 230° C., and is most often between 165° C. and 190° C. The lamination step may also be carried out in two or more stages, such as a first stage between 100° C. and 150° C. and a second stage at between 165° C. and 190° C. The pressure is usually between 50 N/cm$^2$ and 500 N/cm$^2$. The lamination step is usually carried out for a time of from 1 minute to 200 minutes, and most often for 45 minutes to 90 minutes. The lamination step may optionally be carried out at higher temperatures for shorter times (such as in continuous lamination processes) or for longer times at lower temperatures (such as in low energy press processes).

(5) Optionally, the resulting laminate, for example, a copper-clad laminate, may be post-treated by heating for a time at high temperature and ambient pressure. The temperature of post-treatment is usually between 120° C. and 250° C. The post-treatment time usually is between 30 minutes and 12 hours.

It is conventional in the preparation of epoxy-containing laminates to incorporate into the epoxy resin composition various additives to improve the flame-retardancy of the resulting laminate. Many types of flame retardant additives have been suggested, but the additives which are most widely used commercially are halogen-containing additives, such as tetrabromodiphenylolpropane, or epoxy resins prepared by reacting diglycidyl ether of bisphenol-A with tetrabromodiphenylolpropane. Typically, in order to reach the desired fire retardancy level (V-0 in the standard "Underwriters Laboratory" test method UL 94), levels of such bromine-containing flame retardant additives are required which provide a bromine content of from 10 wt % to 25 wt % based on the total polymer weight in the product.

Although halogen-containing fire-retardant additives such as tetrabromodiphenylolpropane, are effective, they are considered by some to be undesirable from an environmental standpoint, and in recent years there has been increasing interest in the formulation of halogen-free epoxy resins, which are able to meet the fire retardancy requirements.

Proposals have been made to use phosphorus-based flame retardants instead of halogenated fire retardants in epoxy resin formulations as described in, for example, EP A 0384939, EP A 0384940, EP A 0408990, DE A 4308184, DE A 4308185, DE A 4308187, WO A 96/07685, and WO A 96/07686. In these formulations a phosphorus flame retardant is pre-reacted with an epoxy resin to form a di- or multifunctional epoxy resin which is then cured with an amino cross-linker such as dicyandiamide, sulfanilamide, or some other nitrogen element-containing cross-linker to form a network.

There are some commercially available phosphorus-based fire retardant additives which may be useful for replacing halogen-containing fire-retardant additives. For example, Amgard™ V19 and Antiblaze™ 1045 (previously Amgard™ P45) supplied by Albright and Wilson Ltd, United Kingdom, are commercially available phosphonic acid ester fire retardant materials. These phosphonic acid esters, may be solids or liquids.

Alkyl and aryl substituted phosphonic acid esters are compatible with epoxy resins. In particular, lower alkyl (i.e., $C_1$–$C_4$) esters of phosphonic acid are of value because they contain a high proportion of phosphorus, and are thus able to impart good fire retardant properties upon resins in which they are incorporated. However, the phosphonic acid esters are not satisfactory as a substitute for halogenated flame retardants in epoxy resins for the production of electrical laminates, because the use of phosphonic acid esters, used in amounts sufficient to provide the necessary flame retardancy, increases the tendency of the resulting cured epoxy resin to absorb moisture. The moisture absorbency of a cured laminate board is very significant, because laminates containing high levels of moisture tend to blister and fail, when introduced to a bath of liquid solder at temperatures around 260° C., a typical step in the manufacture of printed wiring boards.

Another system, which utilizes a phosphorus-based flame retardant, is described in EP A 0754728. EP A 0754728 describes the production of flame retardant epoxy resin systems by blending epoxy resins with a cyclic phosphonate as a flame retardant and incorporating the cyclic phosphonate into the cured resin. The epoxide resin and phosphonate mixture is crosslinked with a polyamine such as triethylamine, tetra amine, polyamido amines, multi basic acids or their anhydrides for example phthalic anhydride or hexahydrophthalic anhydride. EP A 0754728 indicates that large quantities, such as in excess of 18 wt %, of the phosphorus additive are needed in order for the resin system to meet UL 94 V-0.

WO 99/00451 also discloses flame retardant epoxy resin compositions utilizing phosphonic acid esters. WO 99/00451 discloses the reaction of a phosphonic acid ester with an epoxy resin in the presence of a catalyst and a nitrogen-containing crosslinking agent. The crosslinking agent has an amine functionality of at least 2 and is preferably dicyandiamide. The epoxy resins described in WO 99/00451 have improved flame retardant properties at low levels of phosphonic acid ester flame retardant. However, there is still a need in the industry for a flame retardant epoxy resin composition with improved Tg and flame retardancy.

SUMMARY OF THE INVENTION

The present invention is directed to epoxy resins which meet the desirable standards of fire retardancy without the need for halogen-containing flame retardants. The epoxy resin compositions of the present invention employ relatively low levels of a phosphorus element-containing compound in the resin (for example, to provide from about 0.2 wt % to about 3.5 wt % phosphorus in a solid resin or a solid curing formulation), together with particular combinations of a multi-functional phenolic hardener, an accelerator and a catalyst, and, in preferred embodiments, particular types of epoxy resins. The multi-functional phenolic hardeners, accelerators and catalysts are generally known p se, but their use in conjunction with low levels of fire retardants to obtain compositions which have both good fire retardancy, and yet sufficiently low water absorption has not hitherto been described.

According to one aspect of present invention, there is provided a flame retardant curable phosphorus element-containing epoxy resin composition substantially free of halogen, comprising:

(I) a non-halogenated epoxy resin material selected from:
   (A) a non-halogenated phosphorus element-containing epoxy resin;
   (B) a mixture of:
      (1) a non-halognated, non-phosphorus element-containing epoxy resin, and
      (2) a phosphorus element-containing compound; or
   (C) the reaction product of:
      (3) a non-halogenated epoxy resin; and
      (4) a phosphorus element-containing compound; or
   (D) a combination of tow or more components (A) to (C);

(II)
   (E) a multi-funcitional phenolic crosslinking agent having a hydroxy functionality of at least 2;
   (F) a material which forms a multi-functional phenolic cross-linking agent having a hydroxy functionality of at least 2 upon heating; preferably in amount of from about 50% to about 150% of the stoichiometric amount needed to cure the epoxy resin; or
   (G) a mixture of components (A) and (B); and (III) optionally, a catalyst capable of promoting the reaction of the phenolic/hydroxy group of the multi-functional phenolic crosslinking agent with the epoxy group of the epoxy resin material.

Another aspect of present invention is directed to providing a flame retardant hardener composition substantially free of halogen, comprising:

(a) (i) a multi-functional phenolic crosslinking agent having a hydroxy functionally of at least 2 or (ii) a material which forms a multi-functional phenolic cross-linking agent having a hydroxy functionality of at least 2 upon heating or (iii) a mixture of components (i) and (ii); preferably in an amount of from about 50% to 150% of the stoichiometric amount needed to cure an epoxy resin;

(b) a phosphorus element-containing compound; the phosphorus element-containing compound preferably having an amine, a phosphine, a phosphate, a hydroxy, an anhydride, or an acid functionality, and preferably, in an amount such as to provide from about 0.2 wt % to about 3.5 wt % phosphorus in a final curing formulation composition; and (c) optionally, a Lewis acid inhibitor.

A preferred embodiment of the present invention includes an epoxy resin having a reduced number of aliphatic chain groups in the cured epoxy resin composites network. The lower number of aliphatic chain groups is believed to reduce the methane gas emissions during burning.

It has also been found that the reaction product or epoxy adduct produced by reacting a non-halogenated epoxy resin and a phosphorus element-containing compound surprisingly provides advantageous benefits when used for preparing the flame retardant formulations of the present invention. Accordingly, another aspect of the present invention is directed to a phosphorus element-containing epoxy resin adduct comprising the reaction product of (1) a non-halogenated epoxy resin; and (2) a phosphorus element-containing compound which is preferably a chain extender which has a functionality of from about 1 to about 3, more preferably from about 1.8 to about 2.2. The chain extender may be for example a hydroxy functional or an amine functional compound such as for example 10-(2',5'-dihydroxyphenyl)-9,10-dihydro-9-oxa-10-phosphaphenanthrene-10-oxide.

DETAILED DESCRIPTION OF THE PREFERRED EMBODIMENTS

In its broadest scope, the present invention is a flame retardant epoxy resin composition substantially free of halogen including: (I) a non-halogenated epoxy resin material with some specific amount of phosphorus element therein; and (II) a multi-functional phenolic crosslinking agent having a hydroxy functionality of at least 2. A resin which is "substantially free of halogen" means that the resin is completely free of halogen, i.e. 0% halogen, or that the resin contains some minor amount of halogen that does not affect the properties or performance of the resin, and is not detrimental to the resin. "Substantially free of halogen", therefore, herein includes for example, wherein the resin contains up to about 10 weight percent halogen, but preferably contains less than about 10 weight percent, more preferably less than about 5 weight percent, even more preferably less than about 1 weight percent and most preferably zero weight percent of a halogen in the resin composition.

In order to obtain satisfactory flame retardancy and still provide the benefit of resistance to water absorption, it is important that the amount of the phosphorus element in the resin composition is from about 0.2 wt % to about 3.5 wt %, preferably from about 1 wt % to about 3 wt %, more preferably from about 1.5 wt % to about 2.8 wt %, based on the total amount of the solid curing resin composition.

The multi-functional phenolic cross-linker (II) of the present invention, also referred to interchangeably herein as a hardener or curing agent, preferably contains at least two or more functionalities. The crosslinker (II) may be selected from (E) a phenolic crosslinking agent having a functionality of at least 2; (F) a material or compound which forms a phenolic crosslinking agent having a functionality of at least 2, upon heating or (G) a mixture of components (A) and (B). The phenolic hardeners (II) are compounds, either polymeric or monomeric, which have at least 2 phenolic —OH (hydroxyl groups) capable of reacting with epoxy groups at elevated temperatures. The phenolic hardeners include various types of compounds such as:

a. Phenolic resins obtained from phenols or alkyl phenols and formaldehyde, such as phenol novolacs or resoles, as described in Lee & Neville, section 11–14;

b. 3,4,5-trihydroxybenzoic acid (also known as gallic acid) or its derivatives, or pyrogallol (also known as 1,2,3-trihydroxybenzol), or 1,2,4-trihydroxybenzol (also known as hydroxyhydrochinon);

c. 1,8,9-trihydroxyanthracene(also known as dithranol or 1,8,9-anthracentriol), or 1,2,10-trihydroxyanthracene (also known as anthrarobine);

d. 2,4,5-trihydroxypyrimidine;

e. tris(hydroxyphenyl)methane;

f. dicylcopentadiene phenol novolac;

g. tetraphenolethane; and h. copolymer of styrene and hydroxystyrene.

The chemical structure of some of the phenolic hardeners (II) described above are as follows:

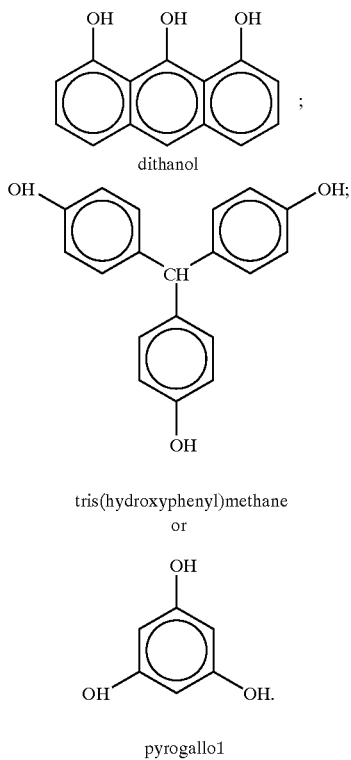

The multi-functional phenolic cross-linker (II) is preferably a novolac or a cresol novolac obtained by the condensation of phenols, cresols, xylenols or other alkyl phenols with a formaldehyde. Also, in the present invention, the resoles may be used as the multi-functional phenolic cross-linker.

Preferably, the multi-functional phenolic cross-linker (II) of the present invention has the following chemical structural formula:

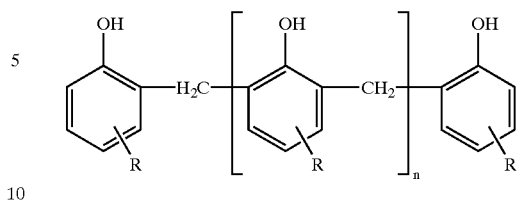

wherein "R" is hydrogen or a $C_1$–$C_3$ alkyl, e.g., methyl; and "n" is 0 or an integer from 1 to 10. "n" preferably has an average value of from 0 to 5. The preferred crosslinker (II) is when R is preferably a hydrogen in the above Formula I.

Commercially available products having the above general Formula I for the crosslinking agent (II) include for example, Perstorp 85.36.28 which is a phenolic resin obtained from phenol and formaldehyde having an average Mettler softening point of 103° C., melt viscosity at 150° C.=1.2 Pa.s and a functionality of 4 to 5. Another example includes Durite SD 1731 from Borden Chemical of USA.

Examples of compounds (F) which form a phenolic crosslinking agent (II) upon heating include phenolic species obtained from heating benzoxazine, for example as illustrated in the following chemical equation:

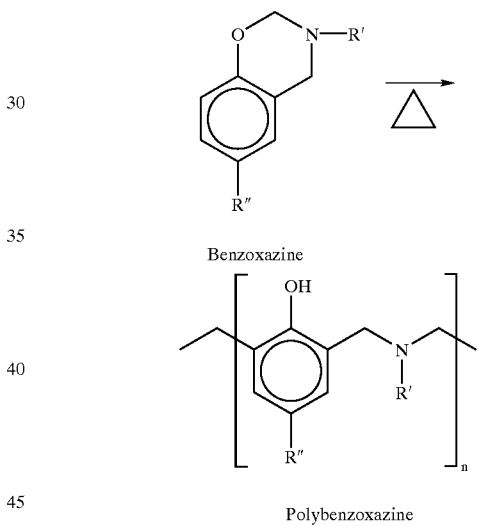

wherein n is greater than 1; and wherein R' and R" may be, independently and separately, the same or different hydrogen, an allyl group from $C_1$–$C_{10}$ such as methyl, a $C_6$–$C_{20}$ aromatic group such as phenyl or a $C_4$–$C_{20}$ cycloaliphatic group such as cyclohexane.

Examples of compounds (F) also include benzoxazine of phenolphthalein, benzoxazine of bisphenol-A, benzoxazine of bisphenol-F, benzoxazine of phenol novolac and the like. Mixtures of components (A) and (B) described above may also be used.

The multi-functional phenolic cross-linker (II) is preferably used in the epoxy resin composition in an amount of from about 50% to about 150% of the stoichiometric amount needed to cure the epoxy resin and more preferably from about 75% to about 125% of the stoichiometric amount needed to cure the epoxy resin, even more preferably from about 85% to about 110% of the stoichiometric amount needed to cure the epoxy resin.

Optionally, other co-cross-linking agents (VII) may be used in combination with the multi-functional phenolic cross-linking agent. Suitable multifunctional co-cross-linkers useful in the present invention are described in numerous references such as Vol. 6 Encyclopedia of Poly. Sci. & Eng., "Epoxy Resins" at 348–56 (J. Wiley & Sons 1986).

Some of the co-cross-linkers (VII) useful in the present invention include, for example, anhydrides such as a carboxylic acid anhydrides, styrene maleic anhydride copolymers, maleic anhydride adducts of methylcyclopentadiene and the like; amino compounds such as dicydiamide, sulfanilamide, 2,4-diamino-6-phenyl-1,3,5 triazine, and the like; carboxylic acids such as salicylic acid, phthalic acid and the like; cyanate esters such as dicyanate of dicyclopentadienyl bisphenol, dicyanate of bisphenol-A and the like; isocyanates such as MDI, TDI and the like; and bismaleic triazines and the like.

In one preferred embodiment, for example, a nitrogen-containing cross-linker (VII) can be used as a subsidiary or co-cross-linker in addition to the multi-functional phenolic cross-linker (II). The nitrogen-containing co-cross-linking agent has an amine functionality of at least 2. Examples of suitable nitrogen-containing cross-linkers useful in the present invention may be found in WO 99/00451, incorporated herein by reference; and include for example, polyamines, polyamides, sulfanilamide, diaminodiphenyl-sulfone and diaminodiphenyl methane and dicyandiamide, substituted dicyandiamide, 2,4-diamino-6-phenyl-1,3,5-triazine. When a nitrogen-containing cross-linker is used in the present formulation, the preferred nitrogen-containing cross-linkers are dicyandiamide, sulfanilamide and 2,4-diamino-6-phenyl-1,3,5-triazine, more preferably sulfanilamide is used.

Another preferred embodiment of co-crosslinkers (VII) useful in the present invention are described in U.S. patent application Ser. No. 09/008983, entitled "Latent Catalysts for Epoxy Curing Systems" filed Jan. 20, 1998, by Gan et al.; which is incorporated herein by reference; and include for example copolymers of styrene and maleic anhydride having a molecular weight ($M_w$) in the range of from 1500 to 50,000 and an anhydride content of more than 15 percent. Commercial examples of these materials include SMA 1000, SMA 2000, and SMA 3000 having styrene-maleic anhydride ratios of 1:1, 2:1, and 3:1 respectively and having molecular weights ranging from 6,000 to 15,000; and which are available from Elf Atochem S.A.

When a co-crosslinker is used in the present invention, the co-crosslinker is present in an amount to crosslink less than 40% of stoichiometric amount needed to cure the epoxy resin. Preferably, the amount of the crosslinking agent in the epoxy resin is from 0 to 40% of the stoichiometric quantity needed to cure the epoxy content of the epoxy resin in the formulation.

The non-halogenated epoxy resin material (I) used in the present invention generally contains a phosphorus element or introduces a phosphorus element into the resin composition of the present invention. Generally, the epoxy resin material (I) is used in an amount of from about 30 wt% to about 95 wt%. The non-halogenated epoxy resin material component (I) may be selected from:(A) a non-halogenated phosphorus element-containing epoxy resin; or (B) a mixture of:(a) non-halogenated, non-phosphorus element-containing epoxy resin, and (b) a phosphorus element-containing compound which can be either reactive with or non-reactive with the non-halogenated non-phosphorous element-containing epoxy resin (C) the reaction product of: (c) a non-halogenated epoxy resin which can be either a phosphorous-element containing epoxy resin or a non-phosphorous-element containing epoxy resin; and (d) a phosphorus element-containing compound or (D) a combination of two or more of components (A) to (C).

Generally, the non-halogenated epoxy resin material (I) used in the present invention is a material which possesses on average more than 1 and preferably at least 1.8, more preferably at least 2 epoxy groups per molecule. In the broadest aspect of the present invention, the epoxy resin material may be any saturated or unsaturated aliphatic, cycloaliphatic, aromatic or heterocyclic compound which possesses more than one 1,2-epoxy group.

In one preferred embodiment, the non-halogenated epoxy resin material (I) is a non-halogenated phosphorus element-containing epoxy resin (A) selected from those described in U.S. Pat. No. 5,376,453, incorporated herein by reference, including for example methyl diglycidyl phosphonate, ethyl diglycidyl phosphonate, propyl diglycidyl phosphonate, butyl diglycidyl phosphonate, vinyl diglycidyl phosphponate, phenyl digycidyl phosphonate and biphenyl diglycidyl phosphonate; methyl diglycidyl phosphate, ethyl diglycidyl phosphate, n-propyl diglycidyl phosphate, n-butyl diglycidyl phosphate, isohbutyl diglycidyl phosphate, allyl diglycidyl phosphate, phenyl diglycidyl phosphate, p-methoxyphenyl diglycidyl phosphate, p-ethoxyphenyl diglycidyl phosphate, p-propyloxyphenyl diglycidyl phosphate, p-isopropyloxyphenyl digycidyl phosphate, phenylthiodiglycidyl phosphate, triglycidyl phosphate, tris(glycidylethyl)phosphate, p-glycidyl-phenyl ethyl glycidyl phosphate, benzyl diglycidyl thiophosphate, and combinations thereof.

The non-halogenated phosphorus element-containing epoxy resin (A) can also be obtained by either:
  (a) reacting an epoxy resin with a phosphorus element-containing compound capable of reacting with an epoxy resin; or
  (b) epoxidizing a phosphorus element-containing compound, such as a diol.

Examples of a non-halogenated phosphorus element-containing epoxy resin (A) useful in the present invention which is obtained by reacting an epoxy resin with a phosphorus element-containing compound capable of reacting with an epoxy resin include:
  (a) The reaction product of: (i) an epoxy novolac, such as D.E.N.* 438 or D.E.N.* 439 which are trademarks of and commercially available from The Dow Chemical Company; a trisepoxy such as Tactix 742 (Trademark of Ciba Geigy); a dicyclopentadiene phenol epoxy novolac; or a glycidyl of tetraphenolethane and (ii) a phosphorus element-containing compound reactive with the epoxy resin such as 9,10-dihydro-9-oxa-10-phosphaphenanthrene-10-oxide, such as "Sanko-HCA" which is commercially available from Sanko of Japan, or "Struktol Polydis PD 3710" which is commercially available from Schill-Seilacher of Germany; or
  (b) the reaction product of: (i) an epoxy novolac, such as D.E.N.* 438 or D.E.N.* 439; a trisepoxy such as Tactix 742; a dicyclopentadiene phenol epoxy novolac; a glycidyl of tetraphenolethane; a diglycidyl ether of bisphenol-A; or a diglycidyl ether of bisphenol-F and (ii) a phosphorus element-containing compound selected from 10-(2',5'-dihydroxyphenyl)-9,10-dihydro-9-oxa-10-phosphaphenanthrene-10-oxide, such as "Sanko HCA—HQ" which is commercially available from Sanko of Japan; bis(4-hydroxyphenyl) phosphine oxide; tris(2-hydroxyphenyl_phosphine oxide; dimethyl-1-bis(4-hydroxyphenyl)-1-phenylmethylphonate; or tris(2-hydroxy-4/5-methylphenyl)phosphine oxide; or (c) the reaction product of an epoxy resin and a phosphite; or (d) the reaction product of an epoxy resin and a phosphinic acid.

Examples of a non-halogenated phosphorus element-containing epoxy resin (A) useful in the present invention which is obtained by epoxidizing a phosphorus element-containing compound include: the epoxidized product of a phosphorus element-containing compound such as 9,10-dihydro-9-oxa-10-phosphaphenanthrene-10-oxide such as "Sanko-HCA" commercially available from Sanko of Japan or "Struktol Polydis PD 3710" commercially available from Schill-Seilacher of Germany; 10-(2',5'-dihydroxyphenyl)-9,10-dihydro-9-oxa-10-phosphaphenanthrene-10-oxide (such as "Sanko HCA—HQ"); bis(4-hydroxyphenyl)phosphine oxide; tris(2-hydroxyphenyl)phosphine oxide; dimethyl-1-bis(4-hydroxyphenyl)-1-phenylmethylphonate; tris(2-hydroxy-4/5-methylphenyl)phosphine oxide tris(4-hydroxyphenyl)phosphine oxide, bis(2-hydroxyphenyl)phenylphosphine oxide, bis(2-hydroxyphenyl)phenylphosphinate, tris(2-hydroxy-5-methylphenyl)phosphine oxide; or mixtures thereof. The epoxidizing of the phosphorus element-containing compound is usually carried out with an epihalohydrin such as epichlorohydrin well known to those skilled in the art.

In still another example of the epoxy resin (A) useful in the present invention is an epoxy resin which is the reaction product of an epoxy compound containing at least two epoxy groups and a chain extender as described in WO 99/00451, incorporated herein by reference. The preferred reaction product described in WO 99/00451 useful in the present invention is an epoxy-polyisocyanate adduct or an epoxy-terminated polyoxazolidone as described in U.S. Pat. No. 5,112,931, incorporated herein by reference. The isocyanate compounds as chain extenders include for example MDI, TDI and isomers thereof.

In another preferred embodiment, the non-halogenated epoxy resin material (I) used in the present invention is (B) a blend or a mixture of (a) non-halogenated, non-phosphorus element-containing epoxy resin compound containing at least two epoxy groups, and (b) a phosphorus element-containing compound. In other words, it is possible to add the phosphorus element-containing compound and the epoxy resin compound mixture to the overall resin composition of the present invention in order to form a non-halogenated phosphorus element-containing epoxy resin material (I) in-situ.

The phosphorus element-containing compound or monomer useful in the present invention contains some reactive groups such as a phenolic group, an acid group, an amino group, an acid anhydride group, a phosphite group, or a phosphinate group which can react with the epoxy groups of the non-halogenated, non-phosphorus element-containing epoxy resin compound.

The phosphorus element-containing compound of the present invention may contain on average one or more than one functionality capable of reacting with the epoxy groups. Such phosphorus element-containing compound preferably contains on average 0.8 to 5, more preferably 0.9 to 4, and most preferably 1 to 3 functional groups capable of reacting with epoxy resin.

The phosphorus element-containing compounds useful in the present invention include for example one or more of the following compounds: P—H functional compounds such as for example HCA, dimethylphosphite, diphenylphosphite, ethylphosphonic acid, diethylphosphinic acid, methyl ethyiphosphinic acid, phenyl phosphonic acid, phenyl phosphinic acid, vinyl phosphoric acid, phenolic (HCA—HQ) and the like; tris(4-hydroxyphenyl)phosphine oxide, bis(2-hydroxyphenyl)phenylphosphine oxide, bis(2-hydroxyphenyl)phenylphosphinate, tris(2-hydroxy-5-methylphenyl)phosphine oxide; acid anhydride compounds such as M-acid-AH and the like; and amino functional compounds such for example bis(4-aminophenyl)phenylphosphate, and mixtures thereof. The chemical structure of some of the compounds described above are as follows:

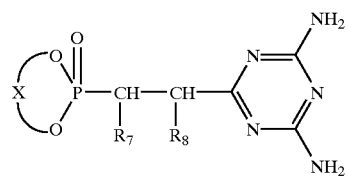

bis(4-aminophenyl)phenyl phosphate wherein X is $CR_3R_4$—$(CR_1R_2)_n$—$CR_5R6$ or o-phenylidene, n is 0 or 1 and $R_1$–$R_8$ may be the same or different and represent H, $CH_3$, or $C_2H_5$.

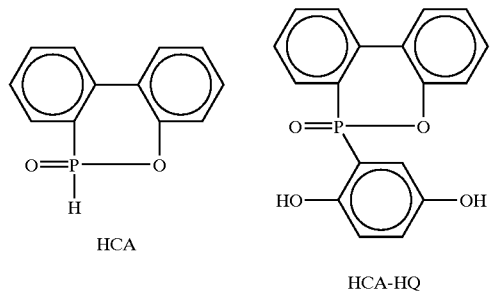

HCA

HCA-HQ

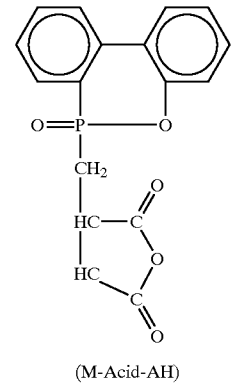

(M-Acid-AH)

The phosphorus element-containing compounds useful in the present invention may also include those compounds having epoxy groups such as those compounds described above as compound (A) for example those having the following structures:

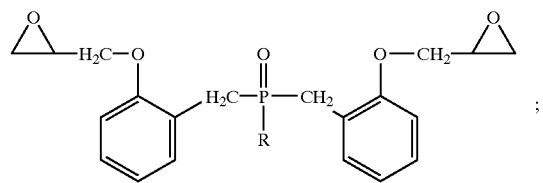

phenyldiglycidyl phosphate

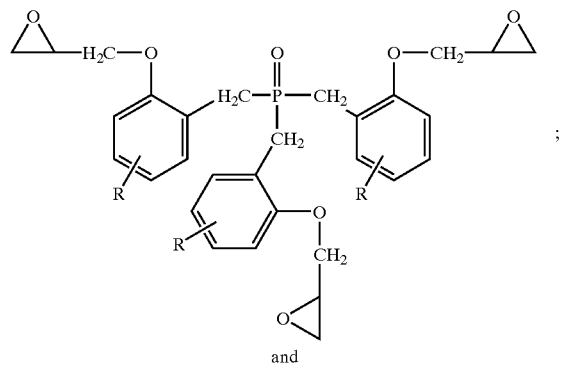

and

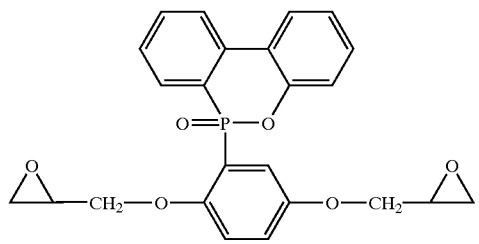

wherein R is independently a hydrogen or an alkyl group from $C_1$–$C_{10}$ such as methyl, ethyl, etc.

In a most preferred embodiment of the present invention, the phosphorus element-containing monomer used in the present invention is for example, 9,10-dihydro-9-oxa-10-phosphaphenanthrene-10-oxide such as "Sanko-HCA" commercially available from SANKO of Japan or "Struktol Polydis PD 3710" commercially available from Schill-Seilacher of Germany; 10-(2',5'-dihydroxyphenyl)-9,10-dihydro-9-oxa-10-phosphaphenanthrene-10-oxide (such as "Sanko HCA—HQ"); bis(4-hydroxyphenyl)phosphine oxide; tris(2-hydroxyphenyl)phosphine oxide; dimethyl-1-bis(4-hydroxyphenyl)-1-phenylmethylphonate; tris(2-hydroxy-4/5-methylphenyl)phosphine oxide; tris(4-hydroxyphenyl)phosphine oxide, bis(2-hydroxyphenyl) phenylphosphine oxide, bis(2-hydroxyphenyl) phenylophosphinate, tris(2-hydroxy-5-methylphenyl) phosphine oxide; or mixtures thereof.

Other phosphorus element-containing compounds which can be used in the present invention, such as isomer mixtures of tris(2-hydroxyhpenyl)phosphine oxides, are described in co-pending U.S. Patent Application entitled "Phosphorus Element-Containing Crosslinking Agents and Flame Retardant Phosphorus Element-Containing Epoxy Resin Compositions Prepared Therewith" Attorney Docket No. 42190, filed of even date herewith, incorporated herein by reference.

The non-halogenated, non-phosphorus element-containing epoxy resin compound useful in the present invention is preferably a compound which has no alkyl aliphatic substituents or has a low amount of alkyl aliphatic sub stituents, such as for example the glycidyl ether of a phenol novolac, or the glycidyl ether of bisphenol-F, the glycidyl ether of bisphenol-S, bisphenol-A, or dihydroxyl ether of fluorene 9-bisphenyl; or trisepoxy, or dicyclopentadiene modified phenol epoxy resin, or mixtures thereof.

The most preferred epoxy resins are epoxy novolac resins (sometimes referred to as epoxidized novolac resins, a term which is intended to embrace both epoxy phenol novolac resins and epoxy cresol novolac resins). Such epoxy novolac resin compounds have the following general chemical structural formula:

Formula II

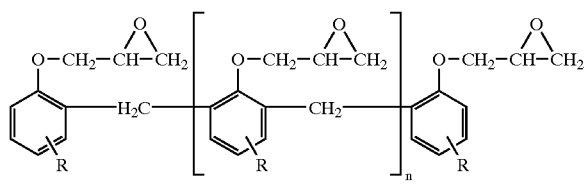

wherein "R" is hydrogen or a $C_1$–$C_3$ alkyl, e.g., methyl; and "n" is 0 or an integer from 1 to 10. "n" preferably has an average value of from 0 to 5. The preferred epoxy novolac resin is when R is preferably a hydrogen in the above Formula II.

Epoxy novolac resins (including epoxy cresol novolac resins) are readily commercially available, for example under the trade names D.E.N.™ (Trademark of The Dow Chemical Company), and Quatrex™ and tris epoxy such as Tactix™ 742 (Trademarks of Ciba). The materials of commerce generally comprise mixtures of various species of the above formula and a convenient way of characterizing such mixtures is by reference to the average, n', of the values of n for the various species. Preferred epoxy novolac resins for use in accordance with the present invention are those in which n' has a value of from about 2.05 to about 10, more preferably from about 2.5 to about 5.

In yet another embodiment, the non-halogenated epoxy resin material (I) added to the overall resin composition of the present invention may be (C) the reaction product of: (c) a non-halogenated epoxy resin and (d) a phosphorus element-containing compound capable of reacting with the non-halogenated epoxy resin. The non-halogenated epoxy resin may be the same as the non-halogenated phosnhorous element-containing epoxy resin or the non-halogenated non-phosphorous element-containing epoxy resin as described above. The phosphorus element-containing compound may be the same as the phosphorus compounds as described above. Examples of the phosphorus element-containing compounds useful in the present invention also include the phosphorus compounds described in EP 0806429, incorporated herein by reference.

The compositions of the present invention may contain a catalyst (III) capable of promoting the reaction between the multi-functional phenolic cross-linker and/or the phosphorus element-containing compound with the epoxy resin and promoting the curing of the epoxy resin.

Examples of suitable catalyst materials (III) useful in the present invention include for example compounds containing amine, phosphine, ammonium, phosphonium, arsonium or sulfonium moieties. Particularly preferred catalysts are heterocyclic nitrogen-containing compounds.

The catalysts (as distinguished from cross-linkers) preferably contain on average no more than about 1 active hydrogen moiety per molecule. Active hydrogen moieties include hydrogen atoms bonded to an amine group, a phenolic hydroxyl group, or a carboxylic acid group. For instance, the amine and phosphine moieties in catalysts are preferably tertiary amine or phosphine moieties; and the ammonium and phosphonium moieties are preferably quaternary ammonium and phosphonium moieties.

Among preferred tertiary amines that may be used as catalysts are those mono- or polyamines having an open-chain or cyclic structure which have all of the amine hydrogen replaced by suitable substituents, such as hydrocarbyl radicals, and preferably aliphatic, cycloaliphatic or aromatic radicals.

Examples of these amines include, among others, 1,8-diazabicyclo(5.4.0) undec-7-en (DBU), methyl diethanol amine, triethylamine, tributylamine, dimethyl benzylamine, triphenylamine, tricyclohexyl amine, pyridine and quinoline. Preferred amines are the trialkyl, tricycloalkyl and triaryl amines, such as triethylamine, triphenylamine, tri-(2, 3-dimethylcyclohexyl)amine, and the alkyl dialkanol amines, such as methyl diethanol amines and the trialkanolamines such as triethanolamine. Weak tertiary amines, for example, amines that in aqueous solutions give a pH less than 10 in aqueous solutions of 1 M concentration, are particularly preferred. Especially preferred tertiary amine catalysts are benzyldimethylamine and tris-(dimethylaminomethyl) phenol.

Examples of suitable heterocyclic nitrogen-containing catalysts include those described in U.S. Pat. No. 4,925,901. Preferable heterocyclic secondary and tertiary amines or nitrogen-containing catalysts which can be employed herein include, for example, imidazoles, benzimidazoles, imidazolidines, imidazolines, oxazoles, pyrroles, thiazoles, pyridines, pyrazines, morpholines, pyridazines, pyrimidines, pyrrolidines, pyrazoles, quinoxalines, quinazolines, phthalozines, quinolines, purines, indazoles, indoles, indolazines, phenazines, phenarsazines, phenothiazines, pyrrolines, indolines, piperidines, piperazines and combinations thereof. Especially preferred are the alkyl-substituted imidazoles; 2,5-chloro-4-ethyl imidazole; and phenyl-substituted imidazoles, and mixtures thereof. Even more preferred are N-methylimidazole; 2-methylimidazole; 2-ethyl-4-methylimidazole; 1,2-dimethylimidazole; and 2-methylimidazole. Especially preferred is 2-phenylimidazole.

Preferably, a Lewis acid (IV) is also employed in the composition of the present invention, especially when the catalyst (III) is particularly a heterocyclic nitrogen-containing compound.

Examples of heterocyclic nitrogen-containing catalysts (III), which are preferably used in combination with Lewis acids (IV) are those described in EP A 526488, EP A 0458502, and GB A 9421405.3, incorporated herein by reference. The Lewis acids useful in the present invention include for example halides, oxides, hydroxides and alkoxides of zinc, tin, titanium, cobalt, manganese, iron, silicon, aluminum, and boron, for example Lewis acids of boron, and anhydrides of Lewis acids of boron, for example boric acid, metaboric acid, optionally substituted boroxines (such as trimethoxyboroxine), optionally substituted oxides of boron, alkyl borates, boron halides, zinc halides (such as zinc chloride) and other Lewis acids that tend to have a relatively weak conjugate base. Preferably the Lewis acid is a Lewis acid of boron, or an anhydride of a Lewis acid of boron, for example boric acid, metaboric acid, an optionally substituted boroxine (such as trimethoxy boroxine, trimethyl boroxine or triethyl boroxine), an optionally substituted oxide of boron, or an alkyl borate. The most preferred Lewis acid is boric acid. These Lewis acids are very effective in curing epoxy resins when combined with the heterocyclic nitrogen-containing compounds, referred to above.

The Lewis acids and amines can be combined before mixing into the formulation or by mixing with the catalyst in-situ, to make a curing catalyst combination. The amount of the Lewis acid employed is preferably at least 0.1 moles of Lewis acid per mole of heterocyclic nitrogen compound, more preferably at least 0.3 moles of Lewis acid per mole of heterocyclic nitrogen-containing compound.

The formulation preferably contains no more than 5 moles of Lewis acid per mole of catalyst, more preferably contains no more than 4 moles of Lewis acid per mole of catalyst and most preferably contains no more than 3 moles of Lewis acid per mole of catalyst. The total amount of the catalyst is from about 0.1 wt % to about 3 wt %, based on the total weight of the composition, preferably from about 0.1 wt % to about 2% wt %.

The compositions of the present invention may also optionally contain one or more additional flame retardant additives (V), including for example, red phosphorus, encapsulated red phosphorus or liquid or solid phosphorus-containing compounds, for example, ammonium polyphosphate such as "Exolit 700" from Clariant GmbH, a phosphite, or phosphazenes; nitrogen-containing fire retardants and/or synergists, for example melamines, melem, cyanuric acid, isocyanuric acid and derivatives of those nitrogen-containing compounds; halogenated flame retardants and halogenated epoxy resins (especially brominated epoxy resins); synergistic phosphorus-halogen containing chemicals or compounds containing salts of organic acids; inorganic metal hydrates such as $Sb_2O_3$, $Sb_3O_5$, aluminum trihydroxide and magnesium hydroxide such as "Zerogen 30" from Martinswerke GmbH of Germany, and more preferably, an aluminum trihydroxide such as "Martinal TS-610" from Martinswerke GmbH of Germany; boron-containing compounds; antimony-containing compounds; and combinations thereof. Examples of suitable additional flame retardant additives are given in a paper presented at "Flame retardants—101 Basic Dynamics—Past efforts create future opportunities", Fire Retardants Chemicals Association, Baltimore Marriot inner harbour hotel, Baltimore Md., Mar. 24–27, 1996.

When additional flame retardants which contain a halogen is used in the composition of the present invention, the halogen-containing flame retardants are present in amounts such that the total halogen content in the epoxy resin composition is less than 10 wt %.

When additional flame retardants which contain phosphorus are present in the composition of the present invention, the phosphorus-containing flame retardants are generally present in amounts such that the total phosphorus content of the epoxy resin composition is from about 0.2 wt % to about 5 wt %.

Also, optionally, other non-flame retardant additives such as inorganic fillers (VI) may be used in the composition of the present invention and may include, for example, talc.

When an inorganic flame retardant, a non-flame retardant or a filler is used in the present invention, the amount of additive or filler present in the epoxy resin composition of the present invention is generally form 0 wt % to about 40 wt %; preferably less than 30 wt % and more preferably less than 10 wt %, depending on the end use application of the epoxy resin composition.

The epoxy resin composition of the present invention may also optionally contain other additives of a generally conventional type including for example, stabilizers, other organic or inorganic additives, pigments, wetting agents, flow modifiers, UV light blockers, and fluorescent additives. These additives can be present in amounts of from 0 to about 5 weight percent, preferably from less than about 3 weight percent. Examples of suitable additives are also described in U.S. Pat. No. 5,066,735 and in C.A. Epoxy Resins—Second Ed. at pages 506–512 (Mercel Dekker, Inc. 1988).

Solvents (VIII) may also optionally be used in the composition of the present invention. When a solvent is used it may include for example, propylene glycolmethylether (Dowanol PM™), methoxypropylacetate (Dowanol PMA™), methylethylketone (MEK), acetone, methanol, and combinations thereof. When a solvent is used in the present invention, the amount of solvent present in the epoxy resin composition of the present invention is generally form 0 wt % to about 50 wt %; preferably from about 10 wt % to about 40 wt % and more preferably from about 10 wt % to about 35 wt %, depending on the end use application of the epoxy resin composition.

Optionally, in some applications it may be desirable to add a small amount of a halogenated epoxy resin (IX), provided the halogenated epoxy resin is added in an amount such that the halogen content of the overall epoxy resin composition of the present invention is less than 10 weight percent.

The compositions of the present invention can be produced by mixing all the components together in any order. Preferably, compositions of the present invention can be produced by preparing a first composition comprising the epoxy resin, and the second composition comprising the multi-functional phenolic hardener. Either the first or the second composition may also comprise a phosphorus element-containing compound, a curing catalyst and/or a nitrogen-containing co-cross-linking agent. All other components may be present in the same composition, or some may be present in the first, and some in the second The first composition is then mixed with the second composition, and cured to produce a fire retardant epoxy resin.

The compositions of the present invention can be used to make composite materials by techniques well known in the industry such as by pultrusion, moulding, encapsulation, or coating.

The present invention is particularly useful for making B-staged prepregs and laminates by well known techniques in the industry.

A number of preferred embodiments of the present invention are illustrated, in the following specific Examples.

EXAMPLES 1–5

Comparative Example A
General Production Procedure for a Polyepoxy and a Phosphorus Element-containing Compound Adduct (Examples 1 and 2)

In Examples 1 and 2, an epoxy resin (D.E.N.* 438) and a phosphorus element-containing compound (Struktol Polydis PD 3710) were heated up to 100° C. under nitrogen purge in a 5-liter flange-top glass reactor equipped with an electrically driven mechanical stirrer, air and nitrogen inlets, sample port, condenser and thermocouple. 1000 ppm based on the total solids of a reaction catalyst triphenylethyl phosphonium acetate, was added to the reactor and the resulting mixture was heated to 130–140° C. to initiate the reaction. The reaction temperature was raised up to at least 160° C. (depending on the size of the reactor) by the heat of reaction. The reaction mixture was kept at least 165° C. for 30 minutes until the theoretical epoxy equivalent weight (EEW=310–330 for D.E.N.* 438 and Polydis PD 3710 phosphorus element-containing compound adduct) was reached. The solid resin was further diluted with methylethylketone (MEK) and methoxypropylacetate (Dowanol* PMA) (50/50) to a 80 wt % solid solution and cooled to room temperature (H20° C.).

General Production Procedure for a Polyepoxy and a Phosphorus Element-containing Compound Adduct and a Varnish Thereof (Example 5)

In Example 5, D.E.N.* 438 was reacted with Sanko HCA—HQ under the same conditions as described above for Examples 1 and 2 to reach an EEW of approximately 264. The resultant solid resin was diluted with MEK and Dowanol PMA* to a 80 wt % solid. Then, Struktal Polydis PD 3710 and Perstorp 85.36.28 phenol novolac were blended in Dowanol PMA to give a 50 wt % solution.

A resultant adduct useful as a varnish herein was formed by mixing together the above 80 wt % solid solution and the above 50 wt % solution according to the amounts described in Table I.

General Production Procedure for a Polyepoxy and a Phosphorus Element-containing Compound Blend (Examples 3 and 4)

In Examples 3 and 4, an epoxy resin (D.E.N.* 438) and a phosphorus element-containing compound (Struktol Polydis PD 3710) were heated up to 110° C. under nitrogen purge in a 5-liter flange-top glass reactor equipped with an electrically driven mechanical stirrer, air and nitrogen inlets, sample port, condenser and thermocouple. The mixture was mixed at 110° C. until a homogeneous clear mixture was obtained. Dowanol* PMA and MEK were added to make 80% solid solution and cooled to room temperature.

General Production Procedure for the Multi-functional Phenolic Novolac Hardener Solution and the Catalyst Solution (Examples 1 to 4)

Perstorp* 85.36.28, a phenolic resin obtained from phenol and formaldehyde having an average Mettler softening point of 103° C., melt viscosity at 150° C.=1.2 Pa.s and a functionality of 4–5, was mixed with Dowanol* PMA at room temperature to make a 50% solid solution.

A catalyst solution was prepared by blending methanol and a catalyst together to form 50 wt. % solution in methanol.

Boric acid solution was prepared by blending methanol and boric acid together to form 20 wt. % solution in methanol.

Preparation of Varnish, B-staged Prepreg, and Laminate

The epoxy resin solution prepared above, the hardener solution prepared above, the catalyst solution prepared above and optionally a boric acid solution were mixed at room temperature with a mechanical stirrer for 60 minutes to make a homogeneous mixture. Additional solvents (methylethylketone, Dowanol* PM, Dowanol* PMA, acetone or mixtures thereof) were added to adjust the varnish viscosity to 30–50 sec. on Ford cup N° 4. The varnishes were aged overnight.

The varnishes were used to impregnate glass web (style Nr. 7628/36 amine silane finish by Porcher SA, France), using a Caratsch pilot treater (3 m long). The temperature of the hot air in the oven was 160–170° C. The varnish composition, the treater conditions, and the prepreg and laminate performance are summarized in Table I below.

The prepreg and laminate varnish of Example 4 additionally contained Martinal TS-610, an aluminum trihydroxide filler material, obtained from Martinswerk GmbH of Germany.

The IPC test methods employed in the Examples herein are the electrical laminate industry standard (The Institute For Interconnection And Packaging Electronic Circuits, 3451 Church Street, Evanston, Ill. 60203), as follows:

| Method | IPC-Test Method Number: |
|---|---|
| Reactivity (varnish) | IPC-TM-650-5.1.410 |
| Rest Geltime @ 170° C., seconds | IPC-TM-650-2.3.18 |
| Mil Flow, weight percent (wt. %) | IPC-TM-650-2.3.17 |
| Tg, ° C. | IPC-TM-650-2.4.25 |
| Copper peel strength | IPC-TM-650-2.4.8 |
| NMP pick-up | Dow method C-TS-AA-1012.00 |
| Pressure Cooker Test, wt. % water pick-up & % passed solder bath @ 260° C. | IPC-TM-650-2.6.16 |
| UL94 Flammability | IPC-TM-650-2.3.10 |

TABLE I

Formulation compositions, properties, prepreg and laminate performance.

| COMPOSITION (in parts solid by weight) | Example 1 | Example 2 | Example 3 | Example 4 | Example 5 | Comparative Example A |
|---|---|---|---|---|---|---|
| DEN438 | 61.4 | 58.5 | 58.5 | 53.46 | 57.9 | 78 |
| HCA-HQ | — | — | — | — | 9.44 | — |
| PD3710 | 17.3 | 17.5 | 17.5 | 13.77 | 11.16 | 22 |
| Phosphonium acetate | 0.079 | 0.076 | In-situ blend | In-situ blend | 0.067 | 0.1 |
| Boric acid | 0.79 | 0.5 | 0.5 | 0.5 | 0.5 | 0.7 |
| Perstorp phenolic novolac hardener | 21.3 | 24 | 24 | 22.77 | 21.5 | — |
| Dicyandiamide | — | — | — | — | — | 2 |
| 2-phenyl imidazole | 0.7 | 0.5 | 0.5 | 0.5 | 0.5 | 2.1 |
| Aluminum trihydroxide | — | — | — | 10 | — | — |
| Additional solvent to achieve desired viscosity | MEK/Dowanol PMA/Dawanol PM | MEK/Dowanol PMA/Dowanol PM | MEK/Dowanol PMA/Dowanol PM | MEK/Dowanol PMA/Dowanol PM | MEK/Dowanol PMA/Dowanol PM | MEK/Dowanol PM |
| VARNISH CHARACTERISTICS | | | | | | |
| Viscosity (Ford cup #4) (seconds) | 45 | 36 | 35 | 6 | 39 | 37 |
| Reactivity, Geltime @ 170° C. (seconds) | 170 | 158 | 160 | 168 | 112 | 255 |
| Treater condition Oven temperature (° C.) Winding speed, (meter/minute) | 172 1.3 | 172 1.5 | 173 1.0 | 173 1.6 | 169 1.5 | 183 0.88 |
| PREPREG CHARACTERISTICS | | | | | | |
| Resin content (wt %) | 47 | 48 | 46 | 43 | 45 | 46 |
| Rest Geltime @ 170° C. (seconds) | 59 | 75 | 60 | 48 | 42 | 99 |
| Mil Flow (wt %) | 27 | 32 | 22 | 20 | 23 | 25 |
| Minimum melt viscosity measured @ 140° C. (Pas) | 107 | 55 | 30 | 31 | 52 | 112 |
| LAMINATE PERFORMANCE | 1.5 hour @ 190° C. | 1.5 hour @ 190° C. | 1.5 hour @ 190° C. | 1.5 hour @ 190° C. | 1.5 hour @ 190° C. | 1.5 hour @ 190° C. |
| Laminate thickness (MM) | 1.50–1.59 | 1.67–1.81 | 1.72–1.86 | 1.40–1.46 | 1.59–1.63 | 1.40–1.68 |
| Tg1/2(° C.) | 129/136 | 126/133 | 136/140 | 132/137 | 140/143 | 131/133 |
| Press Cooker Test, wt % water pick-up/% passed solder bath @260° C. | | | | | | |
| 40 minutes | n.m.* | n.m. | n.m. | n.m. | 0.33/100 | 0.62/100 |
| 60 minutes | 0.43/100 | 0.40/100 | n.d | 0.37/100 | 0.35/75 | 0.73/0 |
| 75 minutes | n.m. | 0.44/50 | 0.43/100 | n.m. | n.m. | n.m. |
| 90 minutes | 0.54/25 | n.m. | 0.5/100 | 0.44/50 | n.m. | n.m. |
| Total burning time (seconds) | 46 | 46 | 27 | 39 | 46 | 40 |
| UL94 | V-0 | V-0 | V-0 | V-O | V-O | V-0 |

*n.m. = not measured

The above results show that the phenolic cure laminate systems of Examples 1–5 exhibit much higher moisture resistance (lower water pick up at longer resistance time) than the dicyandiamide cured system of Comparative Example A.

EXAMPLES 6–9

Examples 6, 7, 8 and 9, shown in Table II below, were prepared according to the "General production procedure for a polyepoxy and a phosphorus element-containing compound adduct" described above, particularly as described according to Example 5. The properties of the resultant adduct are shown in Table II.

TABLE II

| COMPONENT | Example 6 | Example 7 | Example 8 | Example 9 |
|---|---|---|---|---|
| D.E.N. 438 (wt %) | 64.5 | | | |
| D.E.R. 330 (wt %) | | 75 | | |
| D.E.R. 354LV (wt %) | | | 70 | |
| D.E.N. 431 (wt %) | | | | 75 |
| HCA-HQ (wt %) | 10.5 | 25 | 30 | 25 |
| Triphenylethyl-phosphonium acetate catalyst, (ppm) | 1000 | 1000 | 1000 | 1000 |
| PROPERTIES | | | | |
| EEW | 264 | 395 | 451 | 378 |
| Melt viscosity @ 150° C., (Pa's) | 1.2 | 0.76 | 0.88 | 1.6 |

HCA—HQ has very poor solubility in organic solvents and in epoxy resins below 120° C. and it is very difficult to use HCA—HQ without any pre-reaction with an epoxy resin. However, HCA—HQ has high thermal resistance (Tg>130° C.) and has good flame retardancy for cured polymers. HCA—HQ has a 2 phenolic functionality and is useful as a chain extender to increase the molecular weight of epoxy resins. Examples 6 to 9 show that it is possible to increase the molecular weight and melt viscosity of liquid epoxy resins to an appropriate value such as from 0.4 to 1.2 Pa·s at 150° C.

The resin of Example 8 above was made into a varnish composition by blending the resin with a curing agent, a dicydiamide (2 phr), boric acid (0.7 phr) and a catalyst, 2-phenyl imidazole (1.4 phr) in a solvent, Dowanol PMA*. The varnish had a reactivity, geltime at 170° C., of 200 seconds; and a Tg of 135° C. The varnish was cured at 190° C. for 90 minutes.

What is claimed is:

1. A flame retardant phosphorus element-containtng epoxy resin composition substantially free of halogen, comprising:
   (I) a non-halogenated epoxy resin material selected from:
   (A) a non-halogenated, phosphorus element-containing epoxy resin; wherein the non-halogenated, phosphorus element-containing epoxy resin is a reaction product of: (1) an epoxy novolac, an epoxy of tris(hydroxyphenyl)methane, a cresol epoxy novolac, a dicyclopentadiene modified phenol epoxy novolac, a glycidyl of tetraphenol ethane, a diglycidyl ether of bisphenol-A, a diglycidyl ether of bisphenol-F, or mixture thereof; and (2) 9,10-dihydro-9-oxa-10-phosphaphenanthrene-10-oxide; 10-(2',5'-dihydroxyphenyl)-9,10-dihydro-9-oxa-10-phosphaphenanthrene-10-oxide; bis(4-hydroxyphenyl)phosphine oxide; tris(2-hydroxyphenyl)phosphine oxide; dimethyl-1-bis(4-hydroxyphenyl)-1-phenylmethylphonate; tris(2-hydroxy-4/5-methylphenyl)phosphine oxide; dimethyl phosphite; vinyl phosphonic acid; tris(4-hydroxyphenyl)phosphine oxide; bis(2-hydroxyphenyl)phenylphosphine oxide; bis(2-hydroxyphenyl)phenylphosphinate; tris(2-hydroxy-5-methylphenyl)phosphine oxide; or mixtures thereof;
   (B) a combination of (3) Component (A) and (4) a blend of:
   (a) a non-halogenated, non-phosphorus element-containing epoxy resin, and
   (b) a phosphorus element-containing compound;
   (C) a combination of (S) Component (A) and (6) the reaction product of:
   (c) a non-halogenated epoxy resin; and
   (d) a phosphorus element-containing compound; or
   (D) a combination of two or more of Components (A) to (C);
   (II)
   (E) a multi-functional phenolic crosslinking agent having a hydroxy functionality of at least 2;
   (F) a material which forms a multi-functional phenolic crosslinking agent having a hydroxy functionality of at least 2 upon heating; or
   (G) a mixture of Components (E) and (F); and
   (IV) a Lewis acid.

2. The composition of claim 1 wherein the multi-functional phenolic cross-linking agent is present in an amount of from about 50% to about 150% of the stoichiometric amount needed to cure the epoxy resin.

3. The composition of claim 2 wherein the phosphorus element-containing compound, when present, is present in an amount sufficient to provide from about 0.2 weight percent to about 3.5 weight percent phosphorus in the curing composition.

4. The composition of claim 1 wherein the phosphorus element-containing compound, when present, contains functionality selected from an epoxy, a phosphine, a hydroxy, an anhydride, an amine or an acid functionality.

5. The composition of claim 1 wherein the amount of the non-halogenated epoxy resin material based on solids is from about 30 to about 95 weight percent, of the composition.

6. The composition of claim 1 including a catalyst.

7. The composition of claim 6 wherein the Lewis acid is present in an amount of up to about 4 moles per mole of catalyst.

8. The composition of claim 1 wherein the Lewis acid is a boron-containing compound.

9. The composition of claim 8 wherein the Lewis acid is selected from the group comprising boric acid, metaboric acid, boroxines and alkyl borates.

10. The composition of claim 1 including;
    (VI) a filler material.

11. The composition of claim 10 wherein the filler (VI) is an inorganic filler material.

12. The composition of claim 1 wherein the non-halogenated, non-phosphorus element-containing epoxy resin or the non-halogenated epoxy resin is an epoxy-polyisocyanate copolymer.

13. The composition of claim 12 wherein the isocyanate is MDI, TDI or isomers thereof.

14. The composition of claim 1 including:
(VIII) a solvent.

15. The composition of claim 1 wherein the non-halogenated, non-phosphorus element-containing epoxy resin is an epoxy novolac, an epoxy of tris(hydroxyphenyl) methane, a cresol epoxy novolac, a dicyclopentadiene modified epoxy novolac, glycidyl of tetraphenol ethane or mixtures thereof.

16. The composition of claim 1 wherein the phosphorus element-containing compound, when present is 9,10-dihydro-9-oxa-10-phosphaphenanthrene-10-oxide; 10-(2', 5'-dihydroxyphenyl)-9,10-dihydro-9-oxa-10-phosphaphenanthrene-10-oxide; bis(4-hydroxyphenyl) phosphine oxide; tris(2-hydroxyphenyl)phosphine oxide; dimethyl-1-bis(4-hydroxyphenyl)-1-phenylmethylphonate; tris(2-hydroxy-4/5-methylphenyl)phosphine oxide, dimethyl phosphite; vinyl phosphonic acid; tris(4-hydroxyphenyl)phosphine oxide, bis(2-hydroxyphenyl) phenylphosphine oxide, bis(2-hydroxyphenyl) phenylphosphinate, tris(2-hydroxy-5-methylphenyl) phosphine oxide; or mixtures thereof.

17. The composition of claim 1 wherein the multi-functional phenolic crosslinking agent is 2 to 10 functional phenol novolac.

18. The composition of claim 1 wherein the non-halogenated, phosphorus element-containing epoxy resin, when present is a reaction product of; (i) epoxy novolac, epoxy of tris(hydroxyphenyl)methane, dicyclopentadiene modified phenol epoxy novolac, or glycidyl of tetraphenol ethane and (ii) 9,10-dihydro-9-oxa-10-phosphaphenanthrene-10-oxide.

19. The composition of claim 1 wherein the multi-functional phenolic crosslinking agent is selected from phenolic resins obtained from phenols or alkyl phenols and formaldehyde; tris(hydroxyphenol) methane; dicyclopentadiene phenol novolac; tetraphenol ethane; or mixtures thereof.

20. The composition of claim 8 wherein the material which forms a multi-functional phenolic crosslinking agent having a hydroxy functionality of at least 2 upon heating is
(7) a benzoxazine based material; or
(8) a mixture of (e) a benzoxazine based material and (f) a multi-functional phenolic crosslinking agent having a hydroxy functionality of at least 2.

21. The composition of claim 20 wherein the benzoxazine based material is selected from benzoxazine of phenol phthalein, benzoxazine of bisphenol-A, benzoxazine of bisphenol-F, benzoxazine of phenol novolac, and mixtures thereof.

22. The composition of claim 1 which provides a fire material classification of V-O based on UL94 (vertical test).

23. A "B-stage" material made from the composition of claim 1.

24. A laminate made from the composition of claim 1.

25. A process for making a flame retardant phosphorus element-containing epoxy resin composition substantially free of halogen comprising the steps of mixing:
(I) a non-halogenated epoxy resin material selected from:
(A) a non-halogenated, phosphorus element-containing epoxy resin; wherein the phosphorus element-containing epoxy resin is a reaction product of:
(1) an epoxy novolac, an epoxy of tris (hydroxyphenyl)methane, a cresol epoxy novolac, a dicyclopentadiene modified phenol epoxy novolac, a glycidyl of tetraphenol ethane, a diglycidyl ether of bisphenol-A, a diglycidyl ether of bisphenol-F, or a mixture thereof and (2) 9,10-dihydro-9-oxa-10-phosphaphenanthrene-10-oxide; 10-(2',5'-dihydroxyphenyl)-9,10-dihydro-9-oxa-10-phosphaphenanthrene-10-oxide, bis(4-hydroxyphenyl)phosphine oxide; tris(2-hydroxyphenyl)phosphine oxide; dimethyl-1-bis (4-hydroxyphenyl)-1-phenylmethylphonate; tris (2-hydroxy-4/5-methylphenyl)phosphine oxide; dimethyl phosphite; vinyl phosphonic acid; tris(4-hydroxyphenyl)phosphine oxide, bis(2-hydroxyphenyl)phenylphosphine oxide, bis(2-hydroxyphenyl)phenylphosphinate, tris(2-hydroxy-5-methylphenyl)phosphine oxide; or mixtures thereof;
(B) a combination of (3) Component (A) and (4) a blend of:
a non-halogenated, non-phosphorus element-containing epoxy resin, and
a phosphorus element-containing compound;
(C) a combination of 5 Component (A) and (6) The reaction product of:
(c) a non-halogenated epoxy resin; and (d) a phosphorous element-containing compound; or (D) a combination of two or more of components (A) to (C);
(II)
(E) a multi-functional phenolic crosslinking agent having a hydroxy functionality of at least 2;
(F) a material which forms a multi-functional phenolic crosslinking agent having a hydroxy functionality of at least 2 upon heating; or
(G) a mixture of components (E) and (F); and
(IV) Lewis acid.

26. A flame retardant phosphorus element-containing epoxy resin composition substantially free of halogen, comprising:
(I) a non-halogenated epoxy resin material selected from:
(A) a non-halogenated, phosphorus element-containing epoxy resin; wherein the non-halogenated, phosphorus element-containing epoxy resin is a reaction product of: (1) an epoxy novolac, an epoxy of tris(hydroxyphenyl)methane, a cresol epoxy novolac, a dicyclopentadiene modified phenol epoxy novolac, a glycidyl of tetraphenol ethane, a diglycidyl ether of bisphenol-A, a diglycidyl ether of bisphenol-F, or a mixture thereof; and (2)9,10-dihydro-9-oxa-10-phosphaphenanthrene-10-oxide; 10-(2',5'-dihydroxyphenyl)-9,10-dihydro-9-oxa-10-phosphaphenanthrene-10-oxide; bis(4-hydroxyphenyl)phosphine oxide; tris(2-hydroxyphenyl)phosphine oxide; dimethyl-1-bis(4-hydroxyphenyl)-1-phenylmethylphonate; tris(2-hydroxy-4/5-methylphenyl)phosphine oxide; dimethyl phosphite; vinyl phosphonic acid; tris(4-hydroxyphenyl)phosphine oxide; bis(2-hydroxyphenyl)phenylphosphine oxide; bis(2-hydroxyphenyl)phenylphosphinate; tris(2-hydroxyl-5-methylphenyl)phosphine oxide; or mixtures thereof;
(B) a combination of (3) Component (A) and (4) a blend of:
(a) a non-halogenated, non-phosphorus element-containing epoxy resin, and
(b) a phosphorus element-containing compound;
(C) a combination of (5) Component (A) and (6) the reaction product of:

(c) a non-halogenated epoxy resin; and
(d) a phosphorus element-containing compound; or
(D) a combination of two or more of Components (A) to (C);

(II)
(E) a multi-functional phenolic crosslinking agent having a hydroxy functionality of at least 2;
(F) a material which forms a multi-functional phenolic crosslinking agent having a hydroxy functionality of at least 2 upon heating; or
(G) a mixture of Components (E) and (F); and (III) a catalyst capable of promoting the reaction of the phenolic/hydroxy group of the multi-functional phenolic crosslinking agent with the epoxy group of the epoxy resin material, wherein the catalyst is an amine catalyst compound.

27. The composition of claim 26 wherein the catalyst is present in an amount of from about 0.1 weight percent to about 3 weight percent.

28. The composition of claim 26 wherein the catalyst is a heterocyclic nitrogen-containing compound.

29. The composition of claim 26 wherein the catalyst is selected from the group comprising 2-phenylimidazole; 2-methylimidazole; 2-ethyl,4-methylimidazole and imidazole.

30. A flame retardant phosphorus element-containing epoxy resin composition substantially free of halogen, comprising:
(I) a non-halogenated epoxy resin material selected from:
(A) a non-halogenated, phosphorus element-containing epoxy resin; wherein the non-halogenated, phosphorus element-containing epoxy resin is a reaction product of: (1) an epoxy novolac, an epoxy of tris(hydroxyphenyl)methane, a cresol epoxy novolac, a dicyclopentadiene modified phenol epoxy novolac, a glycidyl of tetraphenol ethane, a diglycidyl ether of bisphenol-A, a diglycidyl ether of bisphenol-F, or a mixture thereof; and (2) 9,10-dihydro-9-oxa-10-phosphaphenanthrene-10-oxide; 10-(2',5'-dihydroxyphenyl)-9,10-dihydro-9-oxa-10-phosphaphenanthrene-10-oxide; bis(4-hydroxyphenyl)phosphine oxide; tris(2-hydroxylphenyl)phosphine oxide; dimethyl-1-bis(4-hydroxyphenyl)-1-phenylmethylphonate; tris(2-hydroxy-4/5-methylphenyl)phosphine oxide; dimethyl phosphite; vinyl phosphonic acid; tris(4-hydroxyphenyl)phosphine oxide; bis(2-hydroxyphenyl)phenylphosphine oxide; bis(2-hydroxyphenyl)phenylphosphinate; tris(2-hydroxy-5-methylphenyl)phosphine oxide; or mixtures thereof;
(B) a combination of (3) Component (A) and (4) a blend of:
(a) a non-halogenated, non-phosphorus element-containing epoxy resin, and
(b) a phosphorus element-containing compound;
(C) a combination of (5) Component (A) and (6) the reaction product of:
(c) a non-halogenated epoxy resin; and
(d) a phosphorus element-containing compound; or
(D) a combination of two or more of Components (A) to (C);
(II)
(E) a multi-functional phenolic crosslinking agent having a hydroxy functionality of at least 2;
(F) a material which forms a multi-functional phenolic crosslinking agent having a hydroxy functionality of at least 2 upon heating; or
(G) a mixture of Components (E) and (F); and
(V) a flame-retardant additive.

31. The composition of claim 30 wherein the flame-retardant additive (V) is selected from aluminum trihydroxide, magnesium hydroxide, red phosphorus, encapsulated red phosphorus, ammonium polyphosphate and mixtures thereof.

32. The composition of claim 30 wherein the flame-retardant additive (V) is a halogenated bisphenol A in an amount less than 10 weight percent.

33. The composition of claim 32 wherein the flame retardant (V) is tetrabromobisphenol A.

34. A flame retardant phosphorus element-containing epoxy resin composition substantially free of halogen, comprising:
(I) a non-halogenated epoxy resin material selected from:
(A) a non-halogenated, phosphorus element-containing epoxy resin; wherein the non-halogenated, phosphorus element-containing epoxy resin is a reaction product of: (1) an epoxy novolac, an epoxy of tris(hydroxyphenyl)methane, a cresol epoxy novolac, a dicyclopentadiene modified phenol epoxy novolac, a glycidyl of tetraphenol ethane, a diglycidyl ether of bisphenol-A, a diglycidyl ether of bisphenol-F, or mixture thereof; and (2)9,10-dihydro-9-oxa-10-phosphaphenanthrene-10-oxide; 10-(2',5'-dihydroxyphenyl)-9,10-dihydro-9-oxa-10-phosphaphenanthrene-10-oxide; bis(4-hydroxyphenyl)phosphine oxide; tris(2-hydroxyphenyl)phosphine oxide; dimethyl-1-bis(4-hydroxyphenyl)-1-phenylmethylphonate; tris(2-hydroxy-4/5-methylphenyl)phosphine oxide; dimethyl phosphite; vinyl phosphonic acid; tris(4-hydroxyphenyl)phosphine oxide; bis(2-hydroxyphenyl)phenylphosphine oxide; bis(2-hydroxyphenyl)phenylphosphinate; tris(2-hydroxy-5-methylphenyl)phosphine oxide; or mixtures thereof;
(B) a combination of (3) Component (A) and (4) a blend of:
(a) a non-halogenated, non-phosphorus element-containing epoxy resin, and
(b) a phosphorus element-containing compound;
(C) a combination of (5) Component (A) and (6) the reaction product of:
(c) a non-halogenated epoxy resin; and
(d) a phosphorus element-containing compound; or
(D) a combination of two or more of Components (A) to (C);
(II)
(E) a multi-functional phenolic crosslinking agent having a hydroxy functionality of at least 2;
(F) a material which forms a multi-functional phenolic crosslinking agent having a hydroxy functionality of at least 2 upon heating; or
(G) a mixture of Components (E) and (F); and
(VII) a multi-functional co-crosslinking agent different from the multi-functional phenolic crosslinking agent (II).

35. The composition of claim 34 wherein the multi-functional co-crosslinking agent (VII) is selected from an anhydride, a nitrogen-containing crosslinking agent having an amine functionality of at least 2 and a styrene maleic anhydride copolymer.

36. The composition of claim 35 wherein the co-crosslinking agent (VII) is present in an amount of from 0 to about 40% of the stoichiometric amount needed to cure the epoxy resin.

37. A flame retardant phosphorus element-containing epoxy resin composition substantially free of halogen, comprising:
(I) a non-halogenated epoxy resin material selected from:
(A) a non-halogenated, phosphorus element-containing epoxy resin; wherein the non-halogenated, phosphorus element-containing epoxy resin is a reaction product of: (1) an epoxy novolac, an epoxy of tris(hydroxyphenyl)methane, a cresol epoxy novolac, a dicyclopentadiene modified phenol epoxy novolac, a glycidyl of tetraphenol ethane, a diglycidyl ether of bisphenol-A, a diglycidyl ether of bisphenol-F, or a mixture thereof; and (2) 9,10-dihydro-9-oxa-10-phosphaphenanthrene-10-oxide; 10-(2',5'-dihydroxyphenyl)-9,10-dihydro-9-oxa-10-phosphaphenanthrene-10-oxide; bis(4-hydroxyphenyl)phosphine oxide; tris(2-hydroxyphenyl)phosphine oxide; dimethyl-1-bis(4-hydroxyphenyl)-1-phenylmethylphonate; tris(2-hydroxy-4/5-methylphenyl)phosphine oxide; dimethyl phosphite; vinyl phosphonic acid; tris(4-hydroxyphenyl)phosphine oxide; bis(2-hydroxyphenyl)phenylphosphine oxide; bis(2-hydroxyphenyl)phenylphosphinate; tris(2-hydroxy-5-methylphenyl)phosphine oxide; or mixtures thereof;
(B) a combination of (3) Component (A) and (4) a blend of:
(a) a non-halogenated, non-phosphorus element-containing epoxy resin, and
(b) a phosphorus element-containing compound;
(C) a combination of (5) Component (A) and (6) the reaction product of:
(c) a non-halogenated epoxy resin; and
(d) a phosphorus element-containing compound; or
(D) a combination of two or more of Components (A) to (C);
(II)
(E) a multi-functional phenolic crosslinking agent having a hydroxy functionality of at least 2;
(F) a material which forms a multi-functional phenolic crosslinking agent having a hydroxy functionality of at least 2 upon heating; or
(G) a mixture of Components (E) and (F); and
(IX) a halogenated epoxy resin compound in an amount such that the halogen content in the epoxy resin composition is less than 10 weight percent.

38. A flame retardant hardener composition substantially free of halogen capable of being added to an epoxy resin comprising:
(X) a phosphorus element-containing compound; wherein the phosphorus element-containing compound is 10-(2',5'-dihydroxyphenyl)-9,10-dihydro-9-oxa-10-phosphaphenanthrene-10-oxide;
(XI) (H) a benzoxazine based material; or
(J) a mixture of (8) a benzoxazine based material; and (9) a multi-functional phenolic crosslinking agent having a hydroxy functionality of at least 2; and
(XII) a Lewis acid.

39. A phosphorus element-containing epoxy resin adduct comprising the reaction product of (XIII) a non-halogenated epoxy resin; (XIV) a phosphorus element-containing compound; wherein the phosphorus element-containing compound is 10-(2',5'-dihydroxyphenyl)-9,10-dihydro-9-oxa-10-phosphaphenanthrene-10-oxide; and (XV) a Lewis acid.

* * * * *